United States Patent
Yang

(10) Patent No.: US 11,462,641 B2
(45) Date of Patent: Oct. 4, 2022

(54) SEMICONDUCTOR DEVICE AND METHOD OF FABRICATING THE SAME

(71) Applicant: United Microelectronics Corp., Hsinchu (TW)

(72) Inventor: Ching-Chung Yang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/065,396

(22) Filed: Oct. 7, 2020

(65) Prior Publication Data
US 2022/0059697 A1 Feb. 24, 2022

(30) Foreign Application Priority Data

Aug. 24, 2020 (CN) .......................... 202010855658.6

(51) Int. Cl.
*H01L 29/78* (2006.01)
*H01L 29/66* (2006.01)

(52) U.S. Cl.
CPC ...... *H01L 29/7833* (2013.01); *H01L 29/6656* (2013.01)

(58) Field of Classification Search
CPC ............. H01L 21/28141; H01L 21/815; H01L 21/823468; H01L 21/823864; H01L 29/0649; H01L 29/0653; H01L 29/4238; H01L 29/6653; H01L 29/66553; H01L 29/6656; H01L 29/6659; H01L 29/66689; H01L 29/7833; H01L 29/78621; H01L 29/78627
See application file for complete search history.

(56) References Cited

U.S. PATENT DOCUMENTS

| | | | | |
|---|---|---|---|---|
| 5,663,586 A * | 9/1997 | Lin | ...................... | H01L 29/6659 257/336 |
| 6,911,695 B2 * | 6/2005 | Ahmed | ............... | H01L 29/6656 257/336 |
| 8,803,234 B1 * | 8/2014 | Liao | ..................... | H01L 29/0847 257/335 |
| 9,391,196 B1 * | 7/2016 | Chang | ................... | H01L 29/404 |
| 9,728,616 B2 | 8/2017 | Hsiao et al. | | |
| 9,972,642 B2 | 5/2018 | Hafez et al. | | |
| 2006/0113627 A1 * | 6/2006 | Chen | ................. | H01L 21/76829 257/500 |

* cited by examiner

*Primary Examiner* — David C Spalla
(74) *Attorney, Agent, or Firm* — J.C. Patents

(57) ABSTRACT

A method of fabricating a semiconductor device includes: forming a first transistor including: forming a plurality of lightly doped regions in a substrate; forming a first gate structure on the substrate, the first gate structure covering portions of the plurality of lightly doped regions and a portion of the substrate; forming first spacers on sidewalls of the first gate structure; forming doped region in the lightly doped regions; forming an etching stop layer on the substrate; patterning the etching stop layer and the first gate structure to form a second gate structure, and to form a plurality of trenches between the second gate structure and the first spacers; and forming a first dielectric layer on the substrate to cover the etching stop layer and fill the plurality of trenches. The first dielectric layer filled in the trenches is used as virtual spacers.

18 Claims, 11 Drawing Sheets

SEMICONDUCTOR DEVICE AND METHOD OF FABRICATING THE SAME

CROSS-REFERENCE TO RELATED APPLICATION

This application claims the priority benefit of China application serial no. 202010855658.6, filed on Aug. 24, 2020. The entirety of the above-mentioned patent application is hereby incorporated by reference herein and made a part of this specification.

BACKGROUND

Technical Field

The embodiment of the invention relates to an integrated circuit and a method of fabricating the same, and particularly relates to a semiconductor device and a method of fabricating the same.

Description of Related Art

Along with continuous reduction of device sizes, not only a width of a gate electrode is reduced, but also a width of a spacer is reduced. However, regarding semiconductor devices with two different operating voltages, if the spacer is formed according to the device with a lower operating voltage, the device with a larger operating voltage may cause increase of gate-induced drain leakage (GIDL) and increased variation of a leakage current (IOFF) due to the inadequate width of the spacers.

SUMMARY

An embodiment of the invention is directed to a semiconductor device, which avoids problems of increase of gate-induced drain leakage (GIDL) and increased variation of a leakage current ($I_{OFF}$) caused by inadequate widths of spacers.

An embodiment of the invention is directed to a method of fabricating a semiconductor device, which is compatible with existing processes and adapted to increase a process window.

An embodiment of the invention provides a method of fabricating a semiconductor device, which includes: forming a first transistor including: forming a plurality of lightly doped regions in a substrate; forming a first gate structure on the substrate, the first gate structure covering portions of the plurality of lightly doped regions and a portion of the substrate; forming a plurality of first spacers on sidewalls of the first gate structure; forming a plurality of doped regions on two sides of the plurality of first spacers and in the plurality of lightly doped regions; forming an etching stop layer on the substrate to cover the first gate structure, the plurality of first spacers and the plurality of doped regions; patterning the etching stop layer and the first gate structure to form a second gate structure, and to form a plurality of trenches between the second gate structure and the plurality of first spacers; and forming a first dielectric layer on the substrate to cover the etching stop layer and fill the plurality of trenches. The first dielectric layer filled in the trenches is used as a plurality of virtual spacers.

An embodiment of the invention provides a semiconductor device including a first transistor including a plurality of lightly doped regions separated from each other and located in a substrate; a first gate structure covering a portion of the plurality of lightly doped regions and a portion of the substrate; a plurality of first spacers laterally located beside the first gate structure; a plurality of first doped regions located in the plurality of lightly doped regions on two sides of the plurality of first spacers; an etching stop layer covering the plurality of first spacers and the plurality of first doped regions; a dielectric layer covering the etching stop layer; a plurality of contacts penetrating through the dielectric layer and the etching stop layer to electrically connect the plurality of first doped regions; and a plurality of virtual spacers located between the first gate structure and the plurality of first spacers, wherein materials of the virtual spacers and the dielectric layer are the same.

Based on the above description, in the embodiments of the invention, by forming the virtual spacers between the gate conductive layer and the spacers, a distance between the contact hole and the gate conductive layer is increased, so that the transistors may meet required operating voltages. In addition, the process of forming the virtual spacers in the embodiment of the invention may be compatible with the existing processes and may increase the process window, and may avoid problems of increase of gate-induced drain leakage (GIDL) and increased variation of a leakage current (IOFF) due to inadequate widths of the spacers of the transistor with a larger operating voltage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
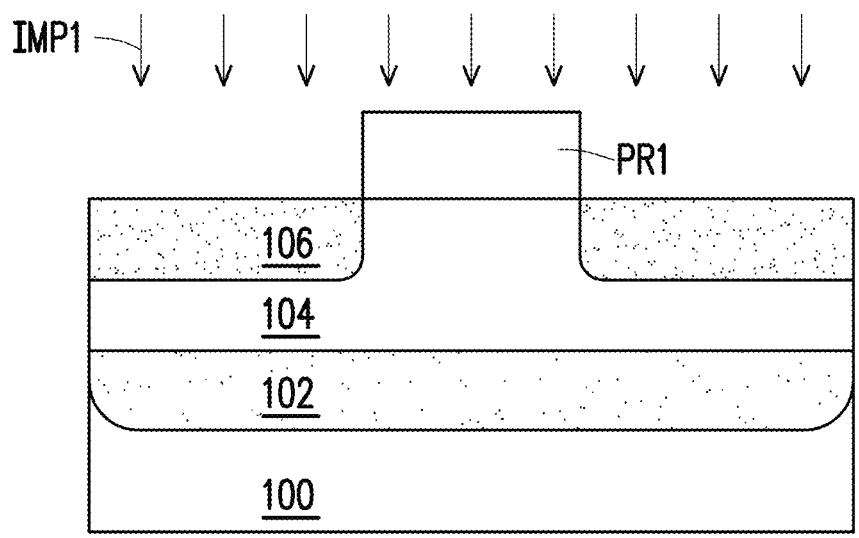
FIG. 1A to FIG. 1I are schematic cross-sectional views of a method for fabricating a semiconductor device according to an embodiment of the invention.

Referring to FIG. 1A, a substrate 100 is provided. The substrate 100 is a semiconductor substrate, such as a doped silicon substrate, an undoped silicon substrate, a silicon-on-insulator (SOI) substrate, or an epitaxial substrate. A well region 102 is formed in the substrate 100, and a well region 104 is formed in the well region 102. The substrate 100 and the well region 104 have, for example, a first conductivity type dopant, and the well region 102 has, for example, a second conductivity type dopant. The second conductivity type is opposite to the first conductivity type. For example, the first conductivity type is a P type, and the second conductivity type is an N type, and vice versa. The P-type dopant is, for example, boron, boron fluoride ($BF_2$), indium (In), or a combination thereof. The N-type dopant is, for example, phosphorus, arsenic or a combination thereof. Then, a lightly doped region 106 is formed in the well region 104. A method of forming the lightly doped region 106 is, for example, to form a mask layer PR1 on the substrate 100, and then an ion implantation process IMP1 is performed to form the lightly doped region 106. The mask layer PR1 is, for example, a patterned photoresist layer.

Figure 1B:
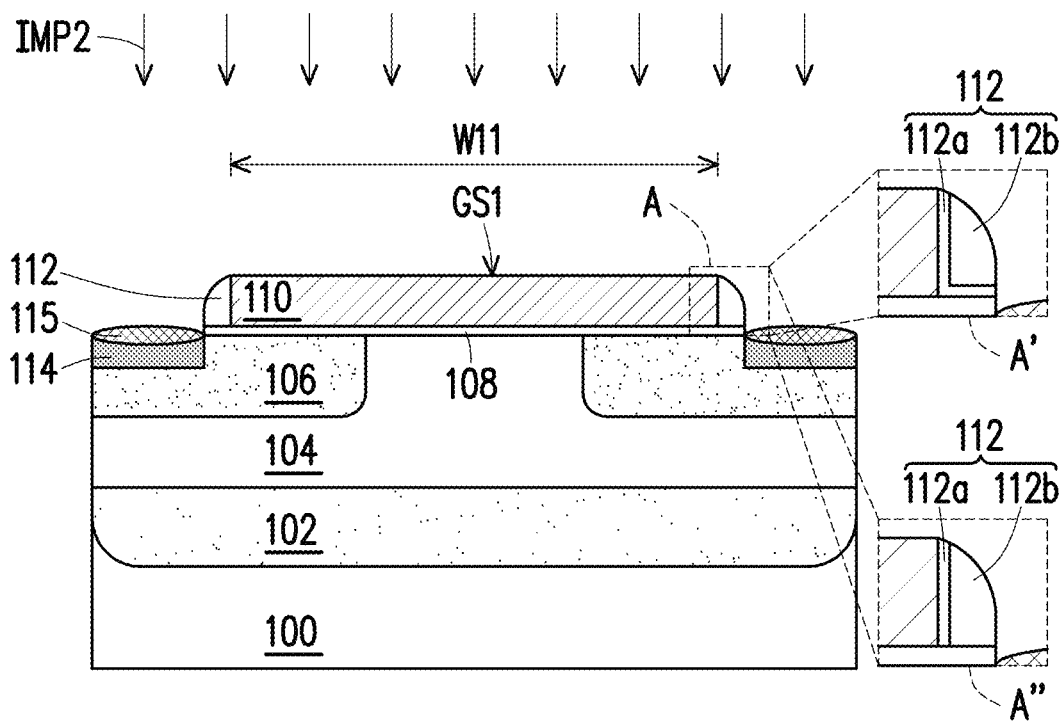

Referring to FIG. 1B, the mask layer PR1 is removed. Then, a gate dielectric layer 108 is formed on the substrate 100. The gate dielectric layer 108 is made of, for example, silicon oxide, silicon nitride, or a high dielectric constant material with a dielectric constant greater than 4, or a combination thereof. The high dielectric constant material may be a metal oxide, such as a rare earth metal oxide. The rare earth metal oxide is, for example, hafnium oxide ($HfO_2$), hafnium silicon oxide (HfSiO), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), zirconium oxide ($ZrO_2$), zirconium silicate oxide ($ZrSiO_4$), hafnium zirconium oxide (HfZrO) or strontium bismuth tantalate ($SrBi_2Ta_2O_9$, SBT), or a combination thereof. A method of forming the gate dielectric layer 108 is, for example, chemical vapor deposition or atomic layer deposition (ALD).

Then, a gate conductive layer 110 is formed on the gate dielectric layer 108. The gate conductive layer 110 covers a part of the gate dielectric layer 108. A method of forming the gate conductive layer 110 is, for example, to form a conductive material layer on the gate dielectric layer 108, and then pattern the conductive material layer through a lithography and etching process. A material of the conductive material layer is, for example, doped polysilicon or undoped polysilicon. In some embodiments, a cap layer (not shown) is further formed on the gate conductive layer 110. The cap layer is a dielectric material, such as silicon oxide or silicon nitride. The gate dielectric layer 108, the gate conductive layer 110, and the cap layer may be collectively referred to as a gate structure GS1.

Then, spacers 112 are formed on sidewalls of the gate conductive layer 110. A method of forming the spacers 112 are to first form a spacer material layer, and then perform an anisotropic etching process. A material of the spacer 112 includes silicon nitride, silicon oxide or a combination thereof. The spacer 112 may be a single-layer structure or a double-layer structure. In some embodiments, the spacer 112 is the double-layer structure including an inner spacer 112a and an outer spacer 112b. The inner spacer 112a is made of silicon oxide, and the outer spacer 112b is made of silicon nitride. The inner spacer 112a has, for example, an I-shape or an L-shape, and the outer spacer 112b has, for example, an I-shape. In some exemplary embodiments, the inner spacer 112a in an area A of FIG. 1B presents the L-shape, and the outer spacer 112b presents the I-shape, as shown in a partially enlarged view A'. The outer spacer 112b is located on a sidewall of a vertical portion of the inner spacer 112a, and covers an upper surface of a horizontal portion of the inner spacer 112a. In some other exemplary embodiments, both of the inner spacer 112a and the outer spacer 112b of the area A of FIG. 1B present the I-shape, as shown in a partially enlarged view A". The outer spacer 112b is located on the sidewall of the inner spacer 112a.

Thereafter, an ion implantation process IMP2 is performed to form a doped region 114 in the lightly doped region 106 on two sides of the spacer 112. The doped region 114 may also be referred to as a heavily doped region. The doped region 114 has a second conductivity type dopant, such as phosphorous, arsenic or a combination thereof. Thereafter, an annealing process may be performed to activate the dopant in the doped region 114.

Referring to FIG. 1B, a metal silicide layer 115 is formed on the doped region 114. The metal silicide layer 115 may be formed by a self-aligned silicide (salicide) process. A method of forming the metal silicide layer 115 is to, for example, form a metal layer on the substrate 100 first. A material of the metal layer may be titanium, molybdenum, cobalt, nickel, platinum or tungsten. A method of forming the metal layer is, for example, a physical vapor deposition method. Then, an annealing process is performed to make the metal layer reacting to form the metal silicide layer 115. Then, the metal layer is removed. When the gate conductive layer 110 is not covered with the cap layer, the gate conductive layer 110 may form the metal silicide layer 115. When the gate conductive layer 110 is covered with the cap layer, the gate conductive layer 110 does not form the metal silicide layer 115.

Figure 1C:
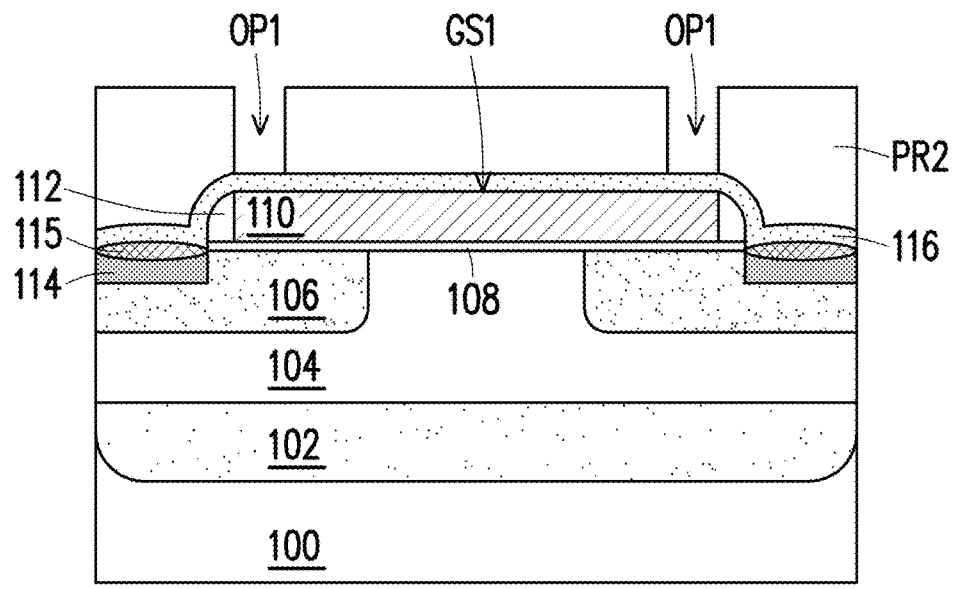
Figure 4A:
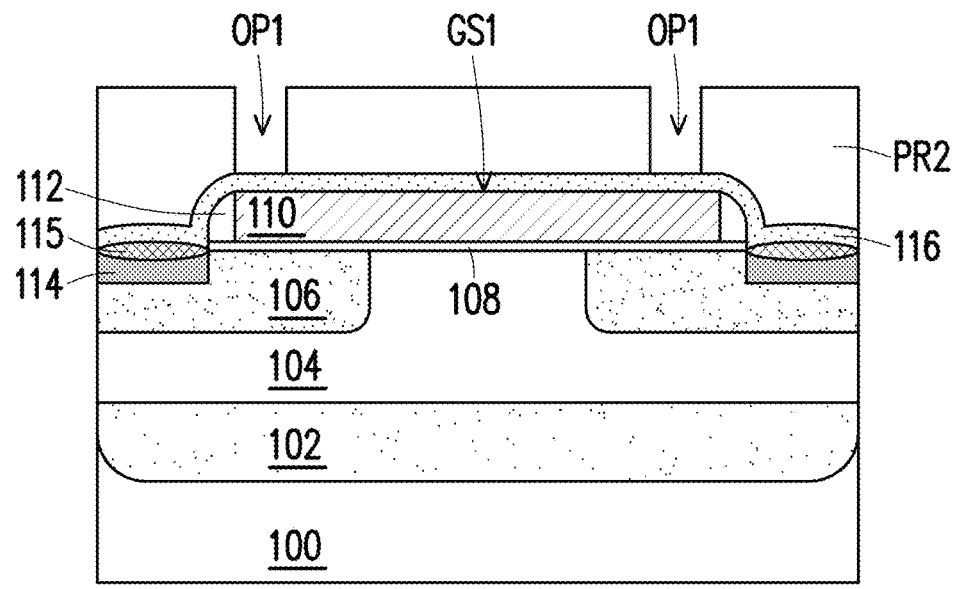
FIG. 4A to FIG. 4D are schematic cross-sectional views of a method for fabricating a semiconductor device according to another embodiment of the invention.

Referring to FIG. 1C, after the metal silicide layer 115 is formed, an etching stop layer 116 is formed on the substrate 100. A material of the etching stop layer 116 is, for example, silicon nitride, silicon oxynitride, silicon carbide, or a combination thereof. A method of forming the etching stop layer 116 is, for example, a chemical vapor deposition method. Then, a mask layer PR2 is formed on the etching stop layer 116. The mask layer PR2 has openings OP1, which exposes the etching stop layer 116 above an edge of the gate conductive layer 110. The mask layer PR2 is, for example, a patterned photoresist layer. The openings OP1 may be formed by performing an exposure and a development on the photoresist layer. In some embodiments, a sidewall of the opening OP1 is aligned with the sidewall of the gate conductive layer 110. In some other embodiments, the sidewall of the opening OP1 is not aligned with the sidewall of the gate conductive layer 110, as shown in FIG. 4A, which is described in detail later.

Figure 1D:
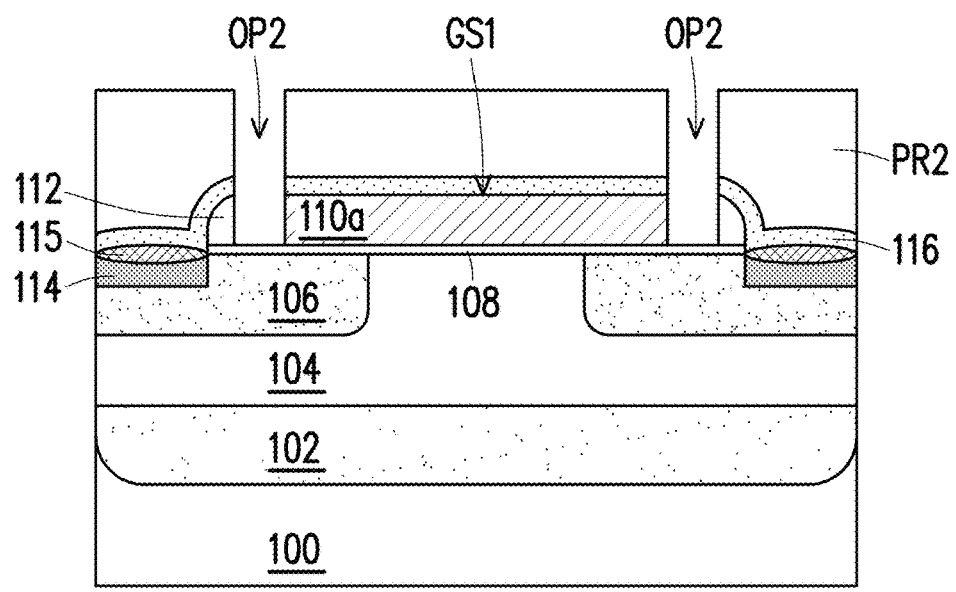

Referring to FIG. 1D, an etching process, such as an anisotropic etching process, is performed to remove the etching stop layer 116 and the gate conductive layer 110 exposed by the openings OP1 to form a gate conductive layer 110a and trenches OP2. In some embodiments, sidewalls of the trenches OP2 expose the etching stop layer 116, the gate conductive layer 110, and the spacers 112, and bottoms of the trenches OP2 expose the gate dielectric layer 118. Since the trenches OP2 are formed, a width W12 of the gate conductive layer 110a is smaller than a width W11 of the gate conductive layer 110.

Figure 1E:
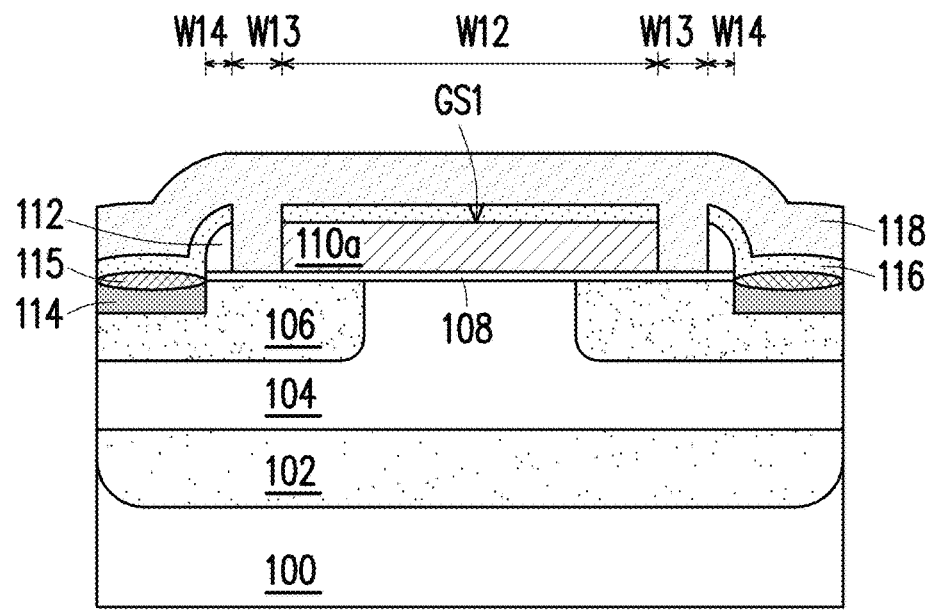

Referring to FIG. 1E, the mask layer PR2 is removed. Then, a dielectric layer 118 is formed on the etching stop layer 116 and in the trenches OP2. A material of the dielectric layer 118 may be silicon oxide, phosphosilicate glass, borophosphosilicate glass, silicon nitride, silicon oxynitride, silicon carbide (SiC), silicon carbide nitride (SiCN), silicon carbide oxynitride (SiCON) or combinations thereof. A method of forming the dielectric layer 118 is, for example, the chemical vapor deposition method or a spin coating method.

Figure 1F:
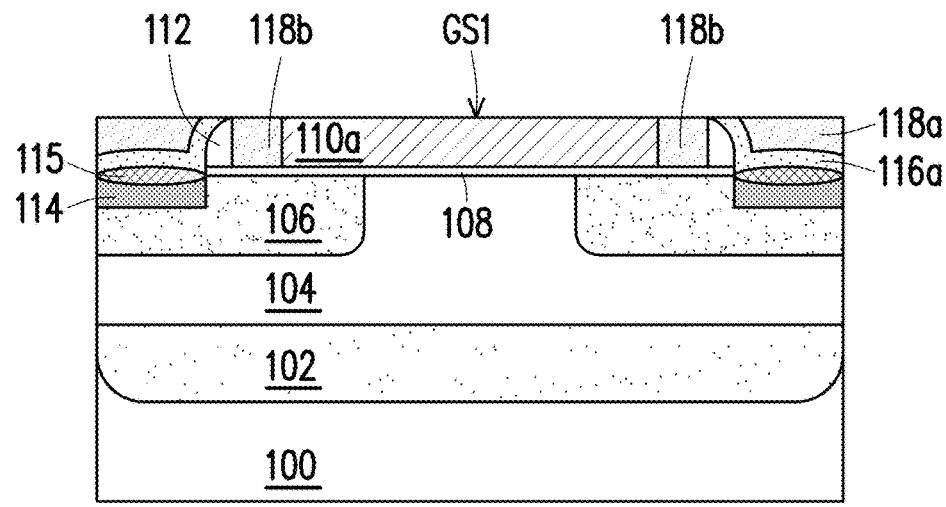

Referring to FIG. 1F, a planarization process, such as a chemical mechanical grinding process, is performed to remove a part of the dielectric layer 118 and a part of the etching stop layer 116 to expose a top surface of the gate conductive layer 110a and leave the dielectric layer 118a, the virtual spacer 118b and the etching stop layer 116a. The dielectric layer 118a covers the etching stop layer 116a. The virtual spacer 118b is left in the trenches OP2 and are located between the gate conductive layer 110a and the spacers 112.

Figure 1G:
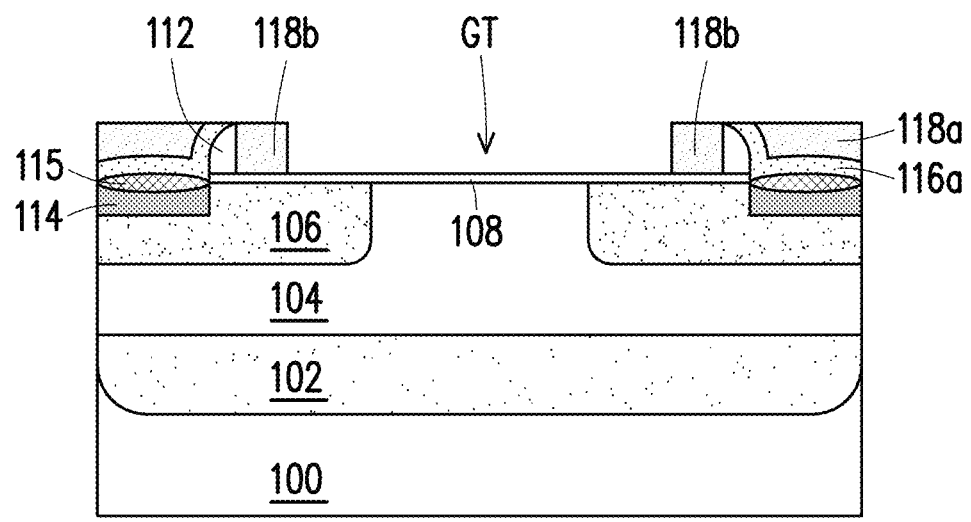
Figure 1H:
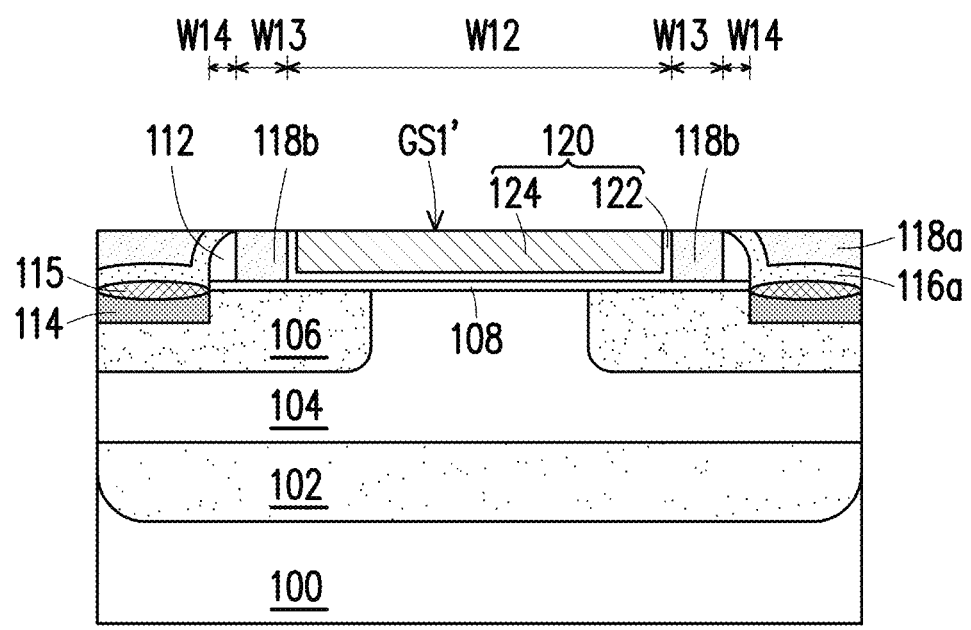

Referring to FIG. 1G and FIG. 1H, in some embodiments, a metal gate replacing process is further performed to replace the gate conductive layer 110a with a gate conductive layer 120. The metal gate replacing process may be performed by using a method described below. First, an etching process, such as an anisotropic etching process, is performed to remove the gate conductive layer 110a and expose the gate dielectric layer 108 to form a gate trench GT. In some embodiments, the gate dielectric layer 108 is not a high dielectric constant material layer, but is only a silicon oxide layer, and the high dielectric constant material layer may be formed in the gate trench GT first. In some other embodiments, the gate dielectric layer 108 is the high dielectric constant material layer. Thereafter, a work function layer 122 is formed on the substrate 100 and in the gate trench GT. A material of the work function layer 122 includes a P-type work function layer or an N-type work function layer. The P-type work function layer includes a metal having a sufficiently large effective work function selected from but not limited to the following group: titanium nitride (TiN), tantalum nitride (TaN), ruthenium (Ru), molybdenum (Mo), tungsten (W), platinum (Pt), or a combination thereof. The P-type work function layer includes a metal having a sufficiently low effective work function selected from but not limited to the following group: titanium (Ti), aluminum (Al), tantalum carbide (TaC), tantalum carbide nitride (TaCN), tantalum silicon nitride (TaSiN), or a combination thereof.

Then, a metal filling layer 124 is formed on the work function layer 122 and fills the gate trench GT. The metal filling layer 124 may include aluminum (Al), tungsten (W), cobalt (Co), copper (Cu), and/or other suitable materials. In some embodiments, a barrier layer (not shown) may be further included between the work function layer 122 and the metal filling layer 124. In some other embodiments, a high dielectric constant material layer (not shown) may be further included between the work function layer 122 and the gate dielectric layer 108. In some other embodiments, a buffer layer may be further included between the work function layer 122 and the gate dielectric layer 108. Thereafter, a planarization process, such as a chemical mechanical planarization process, is performed to remove the metal filling layer 124 and the work function layer 122 except for the gate trench GT. The metal filling layer 124 and the work function layer 122 remained in the gate trench GT are collectively referred to as the gate conductive layer 120. The gate conductive layer 120 and the gate dielectric layer 108 are collectively referred to as a gate structure GS1'.

Figure 1I:
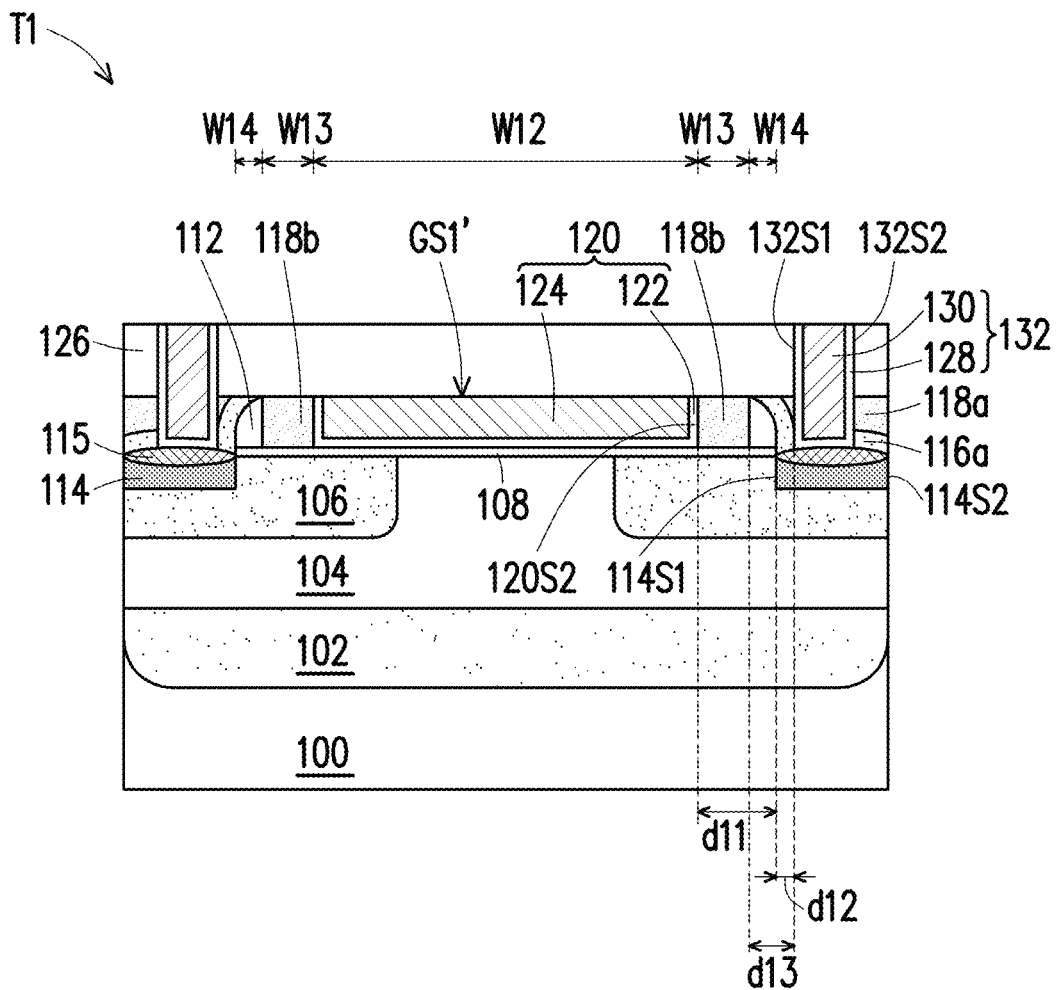

Referring to FIG. 1I, another dielectric layer 126 is formed on the substrate 100. A material of the dielectric layer 126 may be the same as or different from the material of the dielectric layer 118a. A material of the dielectric layer 126 is, for example, silicon oxide, phosphosilicate glass, borophosphosilicate glass, silicon nitride, silicon oxynitride, silicon carbide (SiC), silicon carbide nitride (SiCN), silicon carbide oxynitride (SiCON), a dielectric material with a dielectric constant below 4, or combinations thereof. A method of forming the dielectric layer 126 is, for example, the chemical vapor deposition method or the spin coating method. The dielectric layer 126 may also be selectively subjected to a planarization process, such as a chemical mechanical grinding process, to gain a flat top surface.

Thereafter, contacts 132 electrically connected to the metal silicide layer 115 is formed in the dielectric layer 126. A method of forming the contacts 132 are, for example, to form contact holes in the dielectric layers 126 and 118a and the etching stop layer 116. In some embodiments, the metal silicide layer 115 may also be formed after the contact holes is formed. Thereafter, a metal layer 130 is filled in the contact holes. A material of the metal layer 130 is, for example, tungsten, copper or other suitable materials. A method of forming the metal layer 130 may be the physical vapor deposition method, the chemical vapor deposition method, or a combination thereof. In some embodiments, before the metal layer 130 is formed, a barrier layer 128 is first formed. The barrier layer 128 may be a conformal layer. The barrier layer 128 may be a single layer or a double layer. A material of the barrier layer 128 includes metal, metal nitride, or a combination thereof. The barrier layer 128 is made of tantalum, titanium, tantalum nitride, titanium nitride or other suitable materials. A method of forming the barrier layer 128 may be the physical vapor deposition method, the chemical vapor deposition method, or a combination thereof. After the barrier layer 128 and the metal layer 130 are formed, a planarization process, such as a chemical mechanical grinding process, is performed to remove the barrier layer 128 and the metal layer 130 other than the contact holes, and the remained barrier layer 128 and the metal layer 130 serve as the contact 132.

Figure 2:
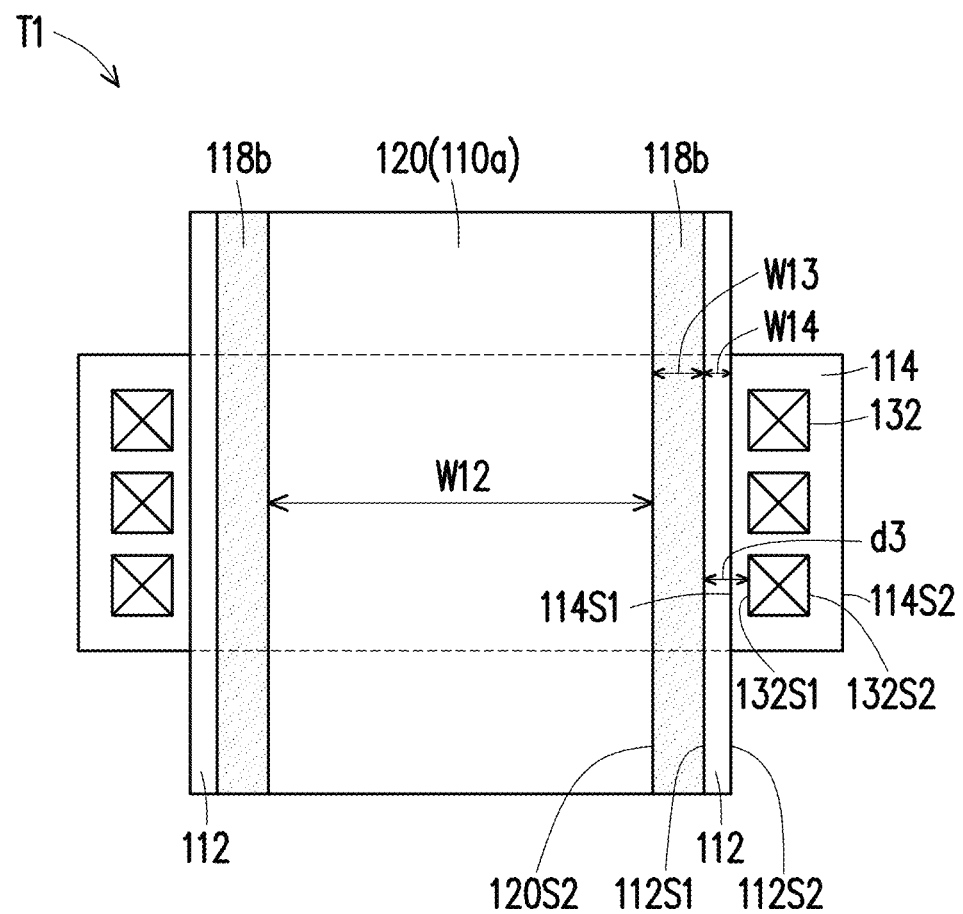
FIG. 2 is a top view of FIG. 1I.

Referring to FIG. 1I and FIG. 2, in the embodiment, the gate structure GS1', the spacers 112, the virtual spacers 118b, the lightly doped regions 106, and the doped regions 114 form a transistor T1. The gate structure GS1' includes the gate conductive layer 120 and the gate dielectric layer 108. The gate conductive layer 120 is disposed on the gate dielectric layer 108. The gate dielectric layer 108 is disposed under the gate conductive layer 120 and extends to the underneath of the spacers 112. The spacers 112 are arranged on the two sides of the gate conductive layer 120 and are not in direct contact with the gate conductive layer 120. The virtual spacers 118b are disposed between the gate conductive layer 120 and the spacers 112 and located above the gate dielectric layer 108. In some embodiments, the virtual spacers 118b and the spacers 112 on the two sides of the gate conductive layer 120 are substantially symmetrical. In some other embodiments, the virtual spacers 118b and the spacers 112 on the two sides of the gate conductive layer 120 are asymmetrical, as shown in FIG. 4D, which will be described in detail later. The lightly doped regions 106 are separated from each other and are covered by the gate structure GS1', the virtual spacers 118b and the spacers 112. The doped regions 114 are located in the lightly doped regions 106 beside the spacers 112. The contacts 132 are electrically connected to the doped regions 114 through the metal silicide layer 115.

The doped region 114 has sidewalls 114S1 and 114S2. The sidewall 114S1 of the doped region 114 is close to the gate conductive layer 120. The sidewall 114S2 of the doped region 114 is far away from the gate conductive layer 120. There is a distance d11 between the sidewall 114S1 of the doped region 114 and a sidewall 120S2 of the gate conductive layer 120. The contact 132 has sidewalls 132S1 and 132S2. The sidewall 132S1 of the contact 132 is close to the gate conductive layer 120. The sidewall 132S2 of the contact 132 is far away from the gate conductive layer 120. There is a distance d12 between the sidewall 132S1 of the contact 132 and the sidewall 114S1 of the doped region 114. In the embodiment, the distance d11 is greater than the distance d12. In addition, the contact 132 and the gate conductive layer 120 also have a sufficient distance (which is a sum of the distance d11 and the distance d12), so that the problems of increase of the gate-induced drain leakage and increased variation of the leakage current caused by an inadequate width W14 of the spacer 112 may be avoided.

In some embodiments, the width W12 of the gate conductive layer 120 is, for example, 0.6 to 1.4 μm. A width W13 of the virtual spacer 118b is, for example, 0.052 to 0.056 µm. The width W14 of the spacer 112 is, for example, 0.024 to 0.026 µm. The spacer 112 has sidewalls 112S1 and 112S2 opposite to each other. The sidewall 112S1 of the spacer 112 is in contact with the virtual spacer 118b, and a distance d13 between the sidewall 112S1 of the spacer 112 and the sidewall 132S1 of the contact 132 is, for example, 0.025 to 0.029 µm.

Figure 3:
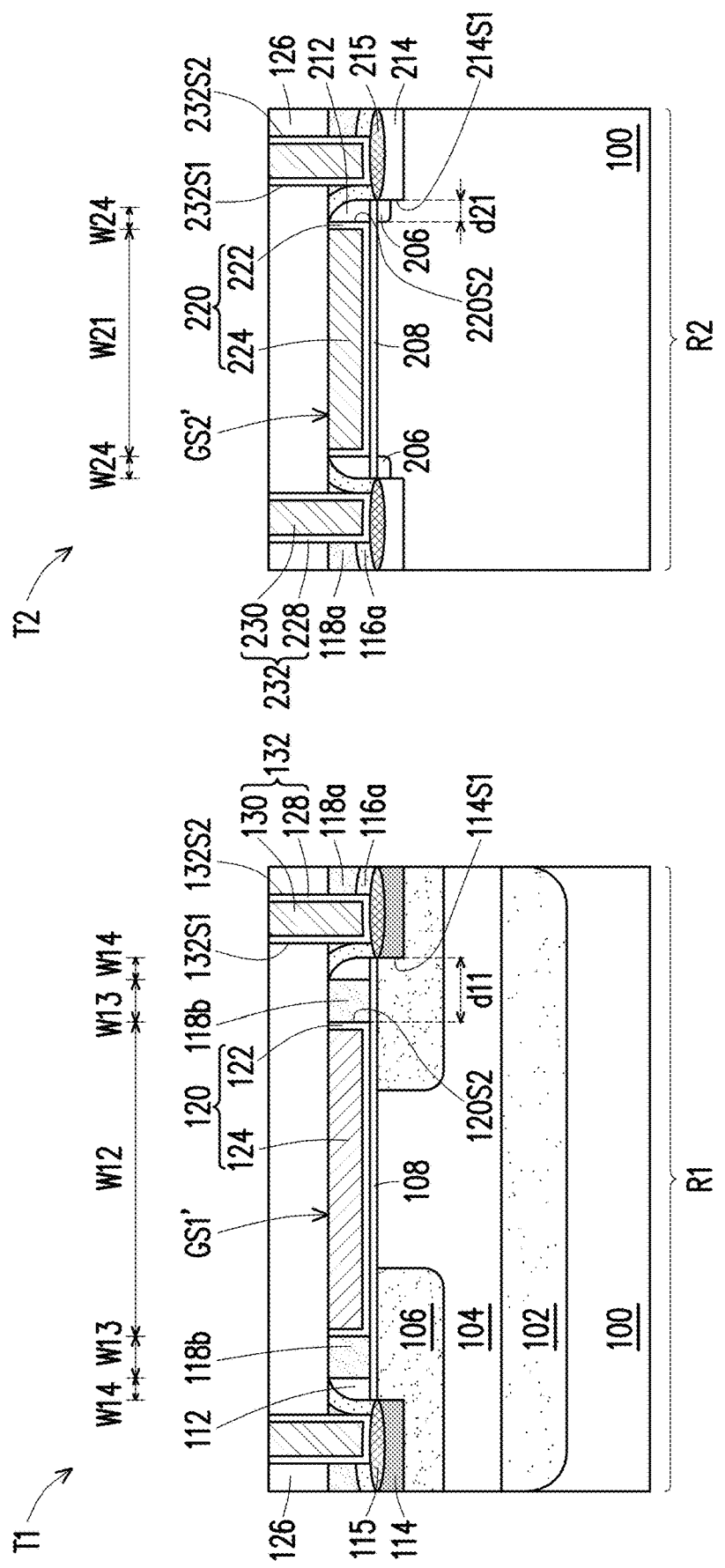
FIG. 3 is a schematic cross-sectional view of a method for fabricating a semiconductor device according to an embodiment of the invention.

Referring to FIG. 3, in some embodiments, the above-mentioned transistor T1 is formed in a region R1 of the substrate 100, and at the same time as the transistor T1 is formed, a transistor T2 is also formed in a region R2 of the substrate 100. The transistor T2 includes a gate structure GS2', spacers 212, lightly doped regions 206 and doped regions 214. There is a metal silicide layer 215 on the doped regions 214. The gate structure GS2' includes a gate conductive layer 220 and a gate dielectric layer 208. An operating voltage of the transistor T2 is smaller than the operating voltage of the transistor T1, and a width W22 of the gate conductive layer 220 of the transistor T2 is smaller than the width W12 of the gate conductive layer 120 of the transistor T1.

The gate dielectric layer 208 of the gate structure GS2' and the gate conductive layer 120 of the gate structure GS1' may be formed simultaneously or separately. In some embodiments, a method of forming the gate dielectric layers 108 and 208 is as follows. A thermal oxidation process is performed to simultaneously form thick silicon oxide layers on the substrate 100 in the regions R1 and R2, and then the thick silicon oxide layer on the substrate 100 in the region R2 is removed. Then, another thermal process is performed to form a thin oxide layer on the substrate 100 in the region R2. At this moment, the thick oxide layer in the region R1 cannot be oxidized, or the thick oxide layer may only be oxidized slightly to increase its thickness slightly.

The gate conductive layer 220 is disposed on the gate dielectric layer 208. The gate conductive layer 220 and the gate conductive layer 120 may be formed at the same time. However, the gate conductive layer 120 is subjected to two patterning processes to reduce its width W11 to the width W12, and then a gate metal replacing process is performed. The gate conductive layer 220 is subjected to one patterning process, so that it always has a width W21. In some embodiments, the width W21 of the gate conductive layer 220 is, for example, 28 nm; and the width W12 of the gate conductive layer 120 is, for example, 1 µm.

The gate conductive layer 220 includes a work function layer 222 and a metal filling layer 224. Materials of the work function layer 222 and the metal filling layer 224 may be the same or similar to the materials of the work function layer 122 and the metal filling layer 124, respectively. The gate dielectric layer 208 is disposed under the gate conductive layer 220 and extends to the underneath of the spacers 212. The transistor T2 does not include virtual spacers. The spacers 212 are disposed on two sides of the gate conductive layer 220 and are in direct contact with the gate conductive layer 220.

The lightly doped regions 206 and the doped regions 214 may be formed in the substrate 100 or in a well region (not shown) of the substrate 100. The lightly doped regions 206 and the doped regions 214 have the same conductivity type, which may be the same as or different from the conductivity type of the doped regions 114. In other words, the lightly doped regions 206 and the doped regions 214 may have the second conductivity type dopant or the first conductivity type dopant. The lightly doped regions 206 are separated from each other, and are located in the substrate 100 on two sides of the gate conductive layer 220 and covered by the spacers 212. The doped regions 214 are located in the substrate 100 beside the spacers 212 and are adjacent to the lightly doped regions 206. In some embodiments, the lightly doped region 206 and the doped regions 214 have the same conductivity type, and the doped regions 214 and the doped regions 114 may be formed simultaneously through a single ion implantation process. In some other embodiments, the doped regions 214 and the doped regions 114 may be respectively formed through an ion implantation process.

Contacts 232 are electrically connected to the doped regions 214 through the metal silicide layer 215. The contact 232 and the contact 132 may be formed simultaneously. The contact 232 includes a barrier layer 228 and a metal layer 230. Materials of the barrier layer 228 and the metal layer 230 may be the same as or similar to the materials of the barrier layer 128 and the metal layer 130, respectively.

The spacers 212 and the spacers 112 are formed at the same time, and the spacers 212 and the spacers 112 are made of the same material, so that the spacers 212 and the spacers 112 have the same structure, and the width W24 of the spacer 212 is substantially the same as the width W14 of the spacer 112.

The spacer 112 and the gate conductive layer 120 of the transistor T1 are separated by a non-zero distance, and they are separated from each other by a virtual spacer 118b. The spacer 212 of the transistor T2 is in direct contact with the gate conductive layer 220, and there is no virtual spacer there between. Since the virtual spacer 118b disposed between the spacer 112 and the gate conductive layer 120 of the transistor T1 of the invention has the width W13, the distance between the doped region 114 and the contact 132 and the gate conductive layer 120 may be increased. In other words, the distance d11 between the sidewall 114S1 of the doped region 114 and the sidewall 120S2 of the gate conductive layer 120 is greater than a distance d21 between a sidewall 214S1 of the doped region 214 and a sidewall 220S2 of the gate conductive layer 220. Therefore, the spacer 112 of the transistor T1 with a larger operating voltage and the spacer 212 of the transistor T2 with a lower operating voltage may be formed at the same time, and the width W14 of the spacer 112 may be formed according to the required width W24 of the spacer 212. Therefore, the semiconductor device of the embodiment of the invention is not only compatible with the existing manufacturing process, but may also make the transistor T1 and the transistor T2 to meet the required operating voltages respectively, and may avoid the problems of increase of gate-induced drain leakage (GIDL) and increased variation of a leakage current (IOFF) caused by the inadequate width W14 of the spacer 112 of the transistor T1.

Figure 4B:
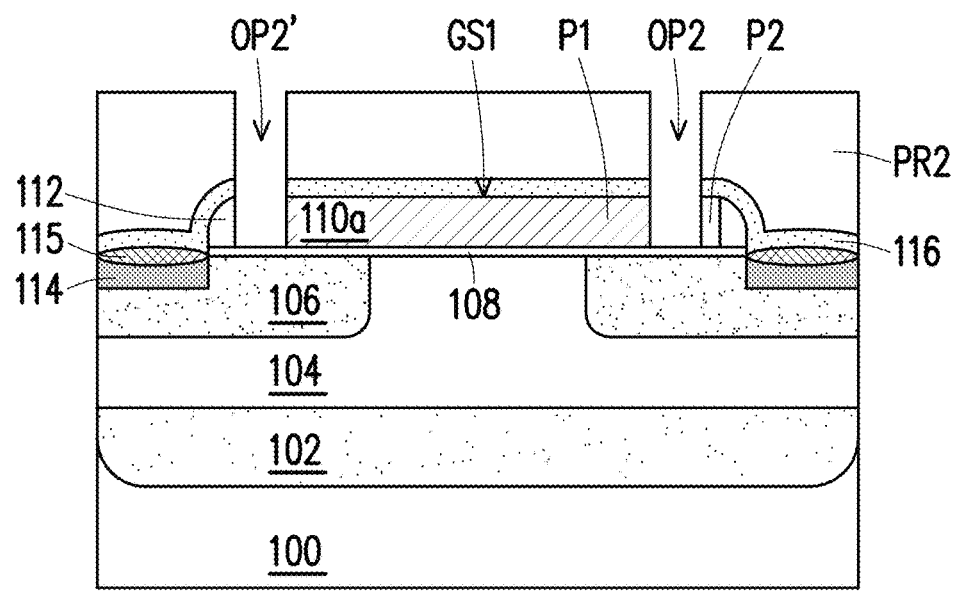
Figure 4C:
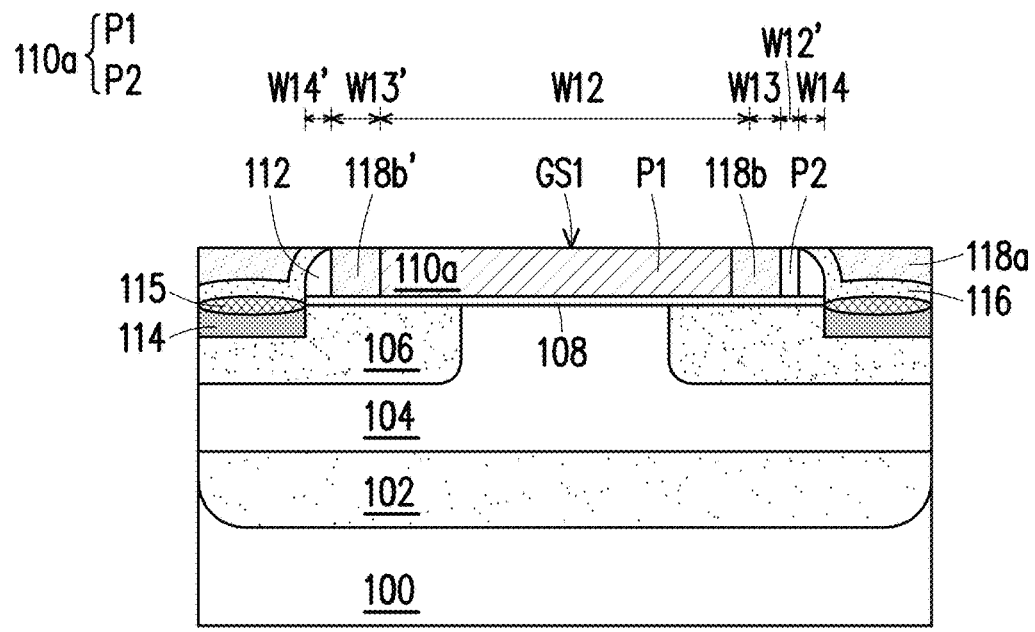
Figure 4D:
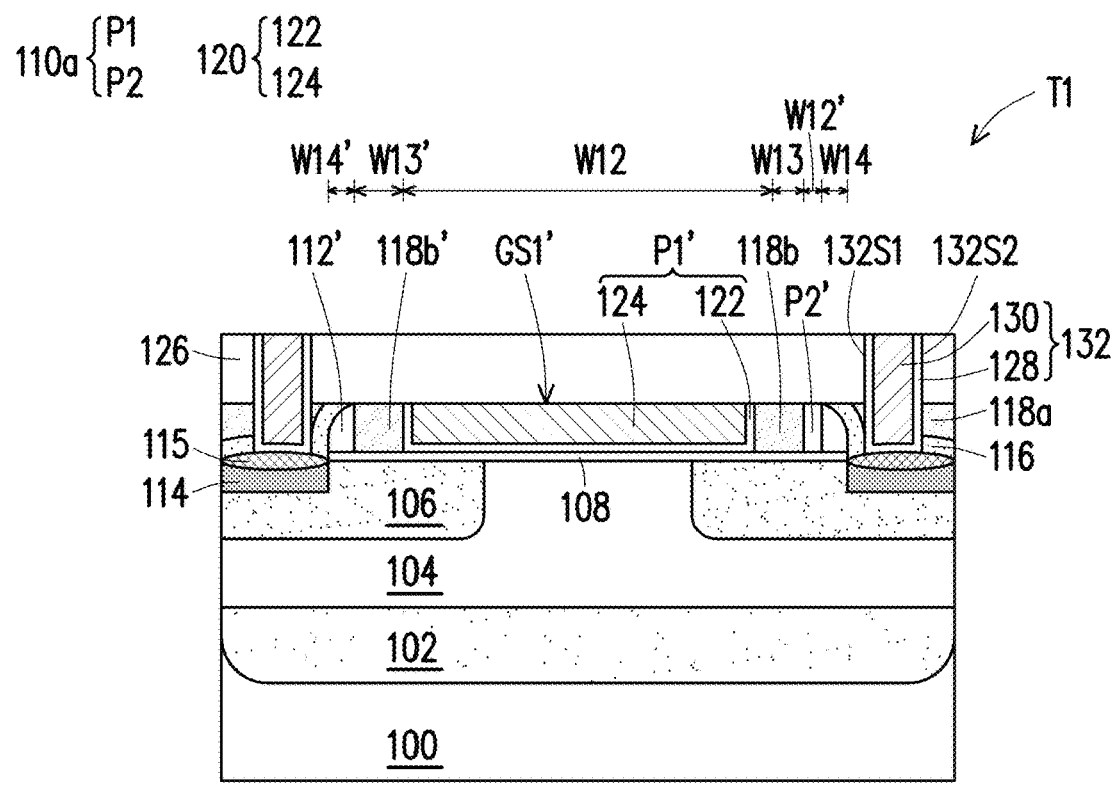

Referring to FIG. 4A to FIG. 4C, in another embodiment, in the above process of forming the openings OP1, if misalignment occurs, the opening OP1 is shifted and is not aligned with the sidewall of the gate conductive layer 110, which may form trenches OP2 and OP2' with different positions, or result in different widths W14 and W14' of the spacers 112. In some embodiments, widths of the trenches OP2 and OP2' are the same. In some other embodiments, etching characteristics of the spacer 112 is different from etching characteristics of the gate conductive layer 110, so that the two trenches OP2 and OP2' with different relative positions and widths are formed. The sidewall of the trench OP2' still exposes the etching stop layer 116, the gate conductive layer 110, and the spacer 112. The sidewall of the trench OP2 exposes the etching stop layer 116 and the gate conductive layer 110, but does not expose the spacer 112. The difference in the widths of the trenches OP2 and OP2' may cause a difference between the width W13 of the subsequently formed virtual spacer 118b and the width W13' of the virtual spacer 118b'.

Figure 5:
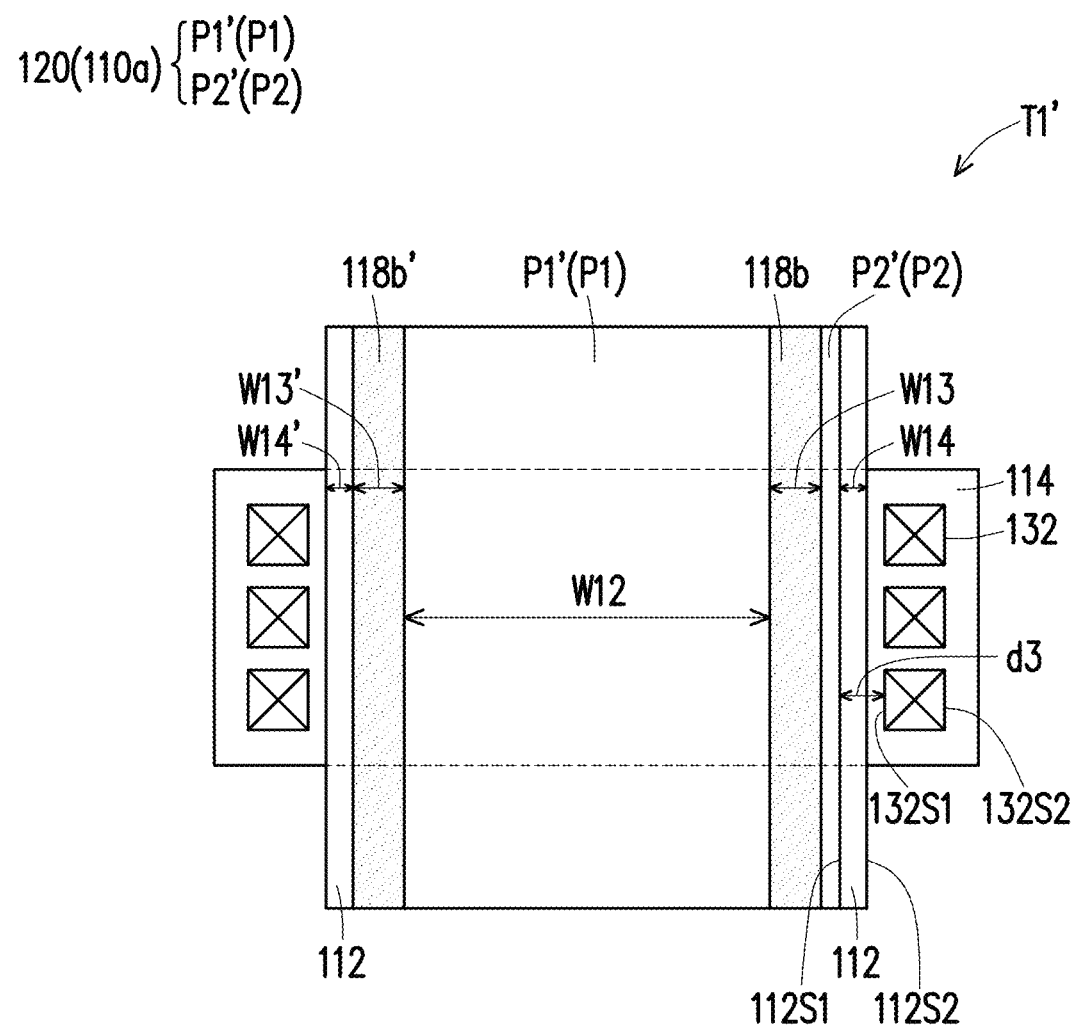
FIG. 5 is a top view of FIG. 4D.

Moreover, the gate conductive layer 110 is divided into two portions P1 and P2. In the subsequent manufacturing process, the portions P1 and P2 will be separated by the subsequently formed virtual spacer 118b, as shown in FIG. 4C and FIG. 5. If the metal gate replacing process of the gate conductive layer 110 is further performed, the portions P1 and P2 are replaced by metals to serve as P1' and P2', as shown in FIG. 4D and FIG. 5. The structure of the portion P1' is similar to that of the aforementioned gate conductive layer 120, which also includes the work function layer 122 and a metal filling layer 124. Both of the portion P1' and the portion P2' are conductive structures. A width W12' of the portion P2' is smaller than the width W12 of the portion P1'. In some embodiments, the width W12' of the portion P2' is sufficiently large, and the structure of the portion P2' may be similar to the structure of the portion P1', and may also include the work function layer 122 and the metal filling layer 124. In some other embodiments, the width W12' of the portion P2' is small, and the structure of the portion P2' may only include the work function layer 122 without the metal filling layer 124.

In the embodiment, the transistor T1' has a left-right asymmetric structure, as shown in FIG. 4D. The virtual spacer 118b on one side of the gate conductive layer 120 is not in contact with the spacer 112, and is separated from the spacer 112 by the portion P2'; the virtual spacer 118b' on the other side of the gate conductive layer 120 is in contact with the spacer 112', and no portion P2' is formed there between.

Figure 6A:
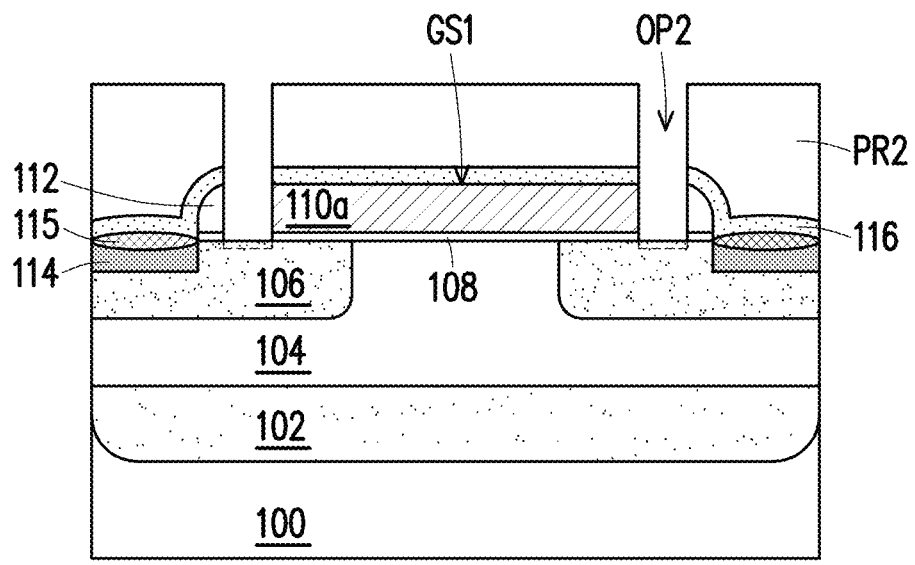
FIG. 6A to FIG. 6B are schematic cross-sectional views of a method for fabricating a semiconductor device according to still another embodiment of the invention.
Figure 6B:
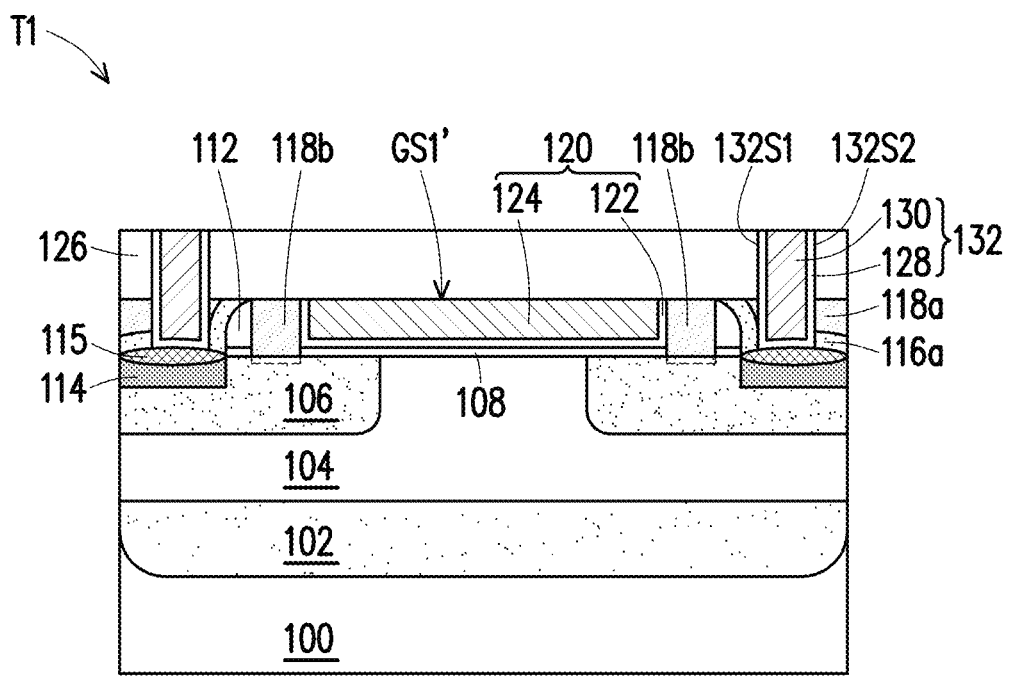

Referring to FIG. 6A, in another embodiment, the above-mentioned etching process for forming the trenches OP2 further removes the gate dielectric layer 118, so that the sidewall of the trenches OP2 expose the etching stop layer 116, the gate conductive layer 110, the spacers 112 and the gate dielectric layer 118, and the bottoms of the trenches OP2 expose the lightly doped regions 106, as shown in FIG. 6A. Therefore, the bottom surface of the subsequently formed virtual spacers 118b is in direct contact with the lightly doped region 106, as shown in FIG. 6B. In some embodiments, the gate dielectric layer 118 is over-etched, so that the trenches OP2 extends into the lightly doped regions 106, and the bottom surfaces and the lower sidewalls of the subsequently formed virtual spacers 118b are in direct contact with the lightly doped regions 106.

In summary, in the embodiments of the invention, the width of the spacer of the transistor with a larger operating voltage may be made according to the width of the spacer required by the transistor with a lower operating voltage, and by forming the virtual spacers between the gate conductive layer and the spacers in the transistor with the larger operating voltage, the two transistors may be made to respectively meet the required operating voltages. The process of forming the virtual spacers in the embodiment of the invention may be compatible with the existing processes and may increase a process window, and may avoid problems of increase of gate-induced drain leakage (GIDL) and increased variation of a leakage current (IOFF) due to inadequate widths of the spacers of the transistor with the larger operating voltage.

What is claimed is:

1. A method of fabricating a semiconductor device, comprising:
    forming a first transistor, comprising:
        forming a plurality of lightly doped regions in a substrate;
        forming a first gate structure on the substrate, the first gate structure covering portions of the plurality of lightly doped regions and a portion of the substrate;
        forming a plurality of first spacers on sidewalls of the first gate structure;
        forming a plurality of doped regions on two sides of the plurality of first spacers and in the plurality of lightly doped regions;
        forming an etching stop layer on the substrate to cover the first gate structure, the plurality of first spacers and the plurality of doped regions;
        patterning the etching stop layer and the first gate structure to form a second gate structure, and to form a plurality of trenches between the second gate structure and the plurality of first spacers; and
        forming a first dielectric layer on the substrate to cover the etching stop layer and fill the plurality of trenches, wherein the first dielectric layer filled in the trenches is used as a plurality of virtual spacers.

2. The method of fabricating the semiconductor device of claim 1, wherein the plurality of trenches expose a gate dielectric layer of the first gate structure.

3. The method of fabricating the semiconductor device of claim 1, wherein the plurality of trenches expose the plurality of doped regions.

4. The method of fabricating the semiconductor device of claim 1, further comprising:
    forming a plurality of metal silicide layers on the plurality of doped regions before the etching stop layer is formed.

5. The method of fabricating the semiconductor device of claim 1, further comprising:
    performing a planarization process on the first dielectric layer until a top surface of the second gate structure is exposed;
    removing a first gate conductive layer of the second gate structure to form a gate trench;
    forming a second gate conductive layer in the gate trench;
    forming a second dielectric layer on the substrate; and
    forming a plurality of contact penetrating through the second dielectric layer, the first dielectric layer and the etching stop layer and electrically connected to the plurality of doped regions.

6. The method of fabricating the semiconductor device of claim 1, further comprising:
    forming a second transistor, wherein an operating voltage of the second transistor is lower than an operating voltage of the first transistor, and a third gate structure of the second transistor is formed simultaneously with the first gate structure of the first transistor.

7. The method of fabricating the semiconductor device of claim 6, wherein
    second spacers of the second transistor and the first spacers of the first transistor are formed simultaneously.

8. A semiconductor device, comprising:
    a first transistor, comprising:
    a plurality of lightly doped regions, separated from each other and located in a substrate;
    a first gate structure, covering portions of the plurality of lightly doped regions and a portion of the substrate;
    a plurality of first spacers, laterally located beside the first gate structure;
    a plurality of first doped regions, located in the plurality of lightly doped regions on two sides of the plurality of first spacers;

an etching stop layer, covering the plurality of first spacers and the plurality of first doped regions;

a dielectric layer, covering the etching stop layer;

a plurality of contacts, penetrating through the dielectric layer and the etching stop layer to electrically connect the plurality of first doped regions; and a plurality of virtual spacers, located between the first gate structure and the plurality of first spacers, wherein materials of the virtual spacers and the dielectric layer are the same, wherein the plurality of lightly doped regions has bottom surfaces lower than bottom surfaces of the plurality of first doped regions, wherein widths of the plurality of virtual spacers are greater than widths of the plurality of first spacers.

9. The semiconductor device of claim 8, wherein the plurality of virtual spacers are in contact with the first gate structure and the plurality of first spacers.

10. A semiconductor device, comprising:
a first transistor, comprising:
a plurality of lightly doped regions, separated from each other and located in a substrate;
a first gate structure, covering portions of the plurality of lightly doped regions and a portion of the substrate;
a plurality of first spacers, laterally located beside the first gate structure;
a plurality of first doped regions, located in the plurality of lightly doped regions on two sides of the plurality of first spacers;
an etching stop layer, covering the plurality of first spacers and the plurality of first doped regions;
a dielectric layer, covering the etching stop layer;
a plurality of contacts, penetrating through the dielectric layer and the etching stop layer to electrically connect the plurality of first doped regions;
a plurality of virtual spacers, located between the first gate structure and the plurality of first spacers, wherein materials of the virtual spacers and the dielectric layer are the same; and
a conductive structure, located between one of the plurality of virtual spacers and one of the plurality of first spacers,
wherein the one of the plurality of virtual spacers is located between and in contact with the conductive structure and the first gate structure, and another one of the plurality of virtual spacers is in contact with the first gate structure and the one of the plurality of first spacers,
wherein widths of the plurality of virtual spacers are greater than widths of the plurality of first spacers.

11. The semiconductor device of claim 8, wherein
a gate dielectric layer of the first gate structure extends between the plurality of virtual spacers and the plurality of lightly doped regions and between the plurality of first spacers and the plurality of lightly doped regions.

12. The semiconductor device of claim 8, wherein
bottom surfaces of the plurality of virtual spacers are in contact with the plurality of lightly doped regions.

13. The semiconductor device of claim 8, wherein there is a first distance between a first sidewall of the plurality of first doped regions adjacent to the first gate structure and the plurality of lightly doped regions adjacent to the first sidewall of the first gate structure, and there is a second distance between the first sidewall of the plurality of first doped regions and the plurality of contact adjacent to a first sidewall of the first gate structure, wherein the first distance is greater than the second distance.

14. The semiconductor device of claim 8, further comprising:
a second transistor, comprising a second gate structure, a plurality of second spacers and a plurality of second doped regions,
wherein an operating voltage of the second transistor is lower than that of the first transistor, and widths of the plurality of second spacers of the second transistor are the same as widths of the plurality of first spacers of the first transistor.

15. The semiconductor device of claim 14, wherein
there is a first distance between a first sidewall of the plurality of first doped regions adjacent to the first gate structure and the first sidewall of the first gate structure,
there is a second distance between a first sidewall of the plurality of second doped regions adjacent to the second gate structure and the first sidewall of the second gate structure,
wherein the first distance is greater than the second distance.

16. The semiconductor device of claim 10, wherein the plurality of virtual spacers are in contact with the first gate structure and the plurality of first spacers.

17. The semiconductor device of claim 10, wherein
a gate dielectric layer of the first gate structure extends between the plurality of virtual spacers and the plurality of lightly doped regions and between the plurality of first spacers and the plurality of lightly doped regions.

18. The semiconductor device of claim 10, wherein
bottom surfaces of the plurality of virtual spacers are in contact with the plurality of lightly doped regions.

* * * * *